(12) United States Patent
Pusheck et al.

(10) Patent No.: US 10,775,402 B2
(45) Date of Patent: Sep. 15, 2020

(54) DEVICE WITH TERMINAL-CONTAINING SENSOR

(71) Applicant: VEONEER US INC., Southfield, MI (US)

(72) Inventors: Jacob Pusheck, West Bloomfield, MI (US); Joshua R. Forwerck, Royal Oak, MI (US)

(73) Assignee: VEONEER US INC., Southfield, MI (US)

( * ) Notice: Subject to any disclaimer, the term of this patent is extended or adjusted under 35 U.S.C. 154(b) by 141 days.

(21) Appl. No.: 15/941,286

(22) Filed: Mar. 30, 2018

(65) Prior Publication Data

US 2019/0302140 A1    Oct. 3, 2019

(51) Int. Cl.

| | |
|---|---|
| *G01P 1/02* | (2006.01) |
| *H01R 13/66* | (2006.01) |
| *H01R 13/504* | (2006.01) |
| *G01D 11/24* | (2006.01) |
| *H01R 13/04* | (2006.01) |
| *H01R 13/41* | (2006.01) |
| *B81B 7/00* | (2006.01) |
| *H01R 13/73* | (2006.01) |

(52) U.S. Cl.
CPC ............ *G01P 1/023* (2013.01); *G01D 11/245* (2013.01); *H01R 13/504* (2013.01); *H01R 13/6683* (2013.01); *B81B 7/0054* (2013.01); *B81B 7/0077* (2013.01); *B81B 2207/098* (2013.01); *H01R 13/04* (2013.01); *H01R 13/41* (2013.01); *H01R 13/73* (2013.01)

(58) Field of Classification Search
CPC ... G01P 1/023; H01R 13/6683; H01R 13/504; H01R 13/04; H01R 13/41; H01R 13/73; G01D 11/245; B81B 2207/098; B81B 7/0077; H81B 7/0054
USPC ............................................. 73/493
See application file for complete search history.

(56) References Cited

U.S. PATENT DOCUMENTS

| | | | |
|---|---|---|---|
| 8,448,512 B2 | 5/2013 | Jocham et al. | ................. 73/493 |
| 8,581,116 B2 | 11/2013 | Ludwig | ........................ 174/480 |
| 8,966,975 B2 | 3/2015 | Campbell et al. | |
| 9,107,309 B2 | 8/2015 | Kurle | |

(Continued)

FOREIGN PATENT DOCUMENTS

| | | | | |
|---|---|---|---|---|
| DE | 102012202982 | 8/2013 | ............. | F16B 19/00 |
| DE | 102014225856 | 6/2016 | ............................ | 1/2 |
| EP | 2955392 | 12/2015 | ........................ | 15/28 |

*Primary Examiner* — Robert R Raevis
(74) *Attorney, Agent, or Firm* — Christopher P. Maiorana, PC

(57) ABSTRACT

An apparatus includes a sensor assembly and a housing assembly. The sensor assembly may have (i) a package surrounding a sensor and (ii) a plurality of terminals integrated with the package. The housing assembly may have (i) a first cavity configured to receive the sensor assembly, (ii) a second cavity configured to receive an electrical connector, (iii) a plurality of ports in communication between the first cavity and the second cavity and (iv) a location feature configured to orient the housing assembly while the housing assembly is mounted to a structure. At least one rib may apply at least one force on the sensor assembly to hold the sensor assembly in the first cavity. The sensor may be outside a plane of the force. The terminals may extend through the ports from the first cavity to the second cavity.

19 Claims, 11 Drawing Sheets

(56) References Cited

U.S. PATENT DOCUMENTS

| | | |
|---|---|---|
| 9,276,351 B2 | 3/2016 | Kunert et al. |
| 9,408,319 B2 | 8/2016 | Haiss et al. |
| 9,533,440 B2 | 1/2017 | Kunert et al. |
| 2007/0243760 A1* | 10/2007 | Fujita ................. G01N 27/4071 439/585 |
| 2012/0036930 A1 | 2/2012 | Kunert ........................... 73/488 |
| 2012/0247205 A1 | 10/2012 | Hortig et al. ................... 73/431 |
| 2013/0044437 A1 | 2/2013 | Hortig et al. ................. 361/728 |
| 2015/0231870 A1 | 8/2015 | Dannenberg et al. |
| 2015/0268261 A1 | 9/2015 | Murray, Jr. et al. |
| 2016/0139168 A1 | 5/2016 | Ludwig et al. |
| 2018/0023981 A1 | 1/2018 | Forwerck et al. |
| 2018/0090868 A1 | 3/2018 | Forwerck ........................ 13/405 |

\* cited by examiner

DEVICE WITH TERMINAL-CONTAINING SENSOR

FIELD OF THE INVENTION

The invention relates to vehicle sensors generally and, more particularly, to a method and/or apparatus for implementing a device with a terminal-containing sensor.

BACKGROUND

Conventional automotive sensors are created by stitching terminals into housing assemblies and subsequently connecting sensor circuits to the terminals. The conventional approach creates issues for making electrical and mechanical connections between the sensor circuits and the terminals. Therefore, some sensor suppliers integrate the terminals into the sensor packages before being mounted into the housing assemblies. However, the presence of the integrated terminals makes integration of the sensor packages into the housing assemblies difficult.

It would be desirable to implement a device with a terminal-containing sensor.

SUMMARY

The invention concerns an apparatus including a sensor assembly and a housing assembly. The sensor assembly may have (i) a package surrounding a sensor and (ii) a plurality of terminals integrated with the package. The housing assembly may have (i) a first cavity configured to receive the sensor assembly, (ii) a second cavity configured to receive an electrical connector, (iii) a plurality of ports in communication between the first cavity and the second cavity and (iv) a location feature configured to orient the housing assembly while the housing assembly is mounted to a structure. At least one rib may apply at least one force on the sensor assembly to hold the sensor assembly in the first cavity. The sensor may be outside a plane of the force. The terminals may extend through the ports from the first cavity to the second cavity.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a device with a terminal-containing sensor that may (i) press fit a sensor assembly into a housing assembly, (ii) provide a bushing and an anti-rotation tab for precise positioning on a motor vehicle, (iii) rigidly attach the sensor assembly to the housing assembly, (iv) hold the sensor assembly in place by one or more deformable ribs, (v) hold the sensor assembly in place by laser welding, (vi) hold the sensor assembly in place by swaging, (vii) seal the sensor assembly with spin welding, (viii) seal the sensor assembly with a potting material, (ix) allow for simple manufacturing techniques, (x) provide a low-cost solution, (xi) reduce cycle time, (xii) reduce a bill-of-material length and/or (xiii) be implemented with one or more integrated circuits.

In various embodiments, a device may integrate a sensor assembly with integrated male terminal leads by "stitching" (or press fitting) a sensor assembly into a housing assembly. The housing assembly may be designed to accept a stitched sensor method. The sensor assembly may be rigidly attached inside the housing assembly. Attachment mechanisms may include, but are not limited to, deformable ribs, laser welding and swaging. An open end of the housing assembly that accepted the sensor assembly may be sealed before installation on a motor vehicle (e.g., automobile, truck, train and the like). The sealing may include, but is not limited to, potting material and spin welding a cover over the open end. The housing assembly may contain a bushing and an anti-rotation tab for mounting the device to a vehicle at a precise location. Techniques of the invention generally provide for integration of a sensor assembly with male terminals to be integrated into the housing assembly. The device may be simple to manufacture with reduced cycle times and reduced bill-of-material lengths. The device may provide one or more features that allow for alignment and attachment to a vehicle.

Figure 1:
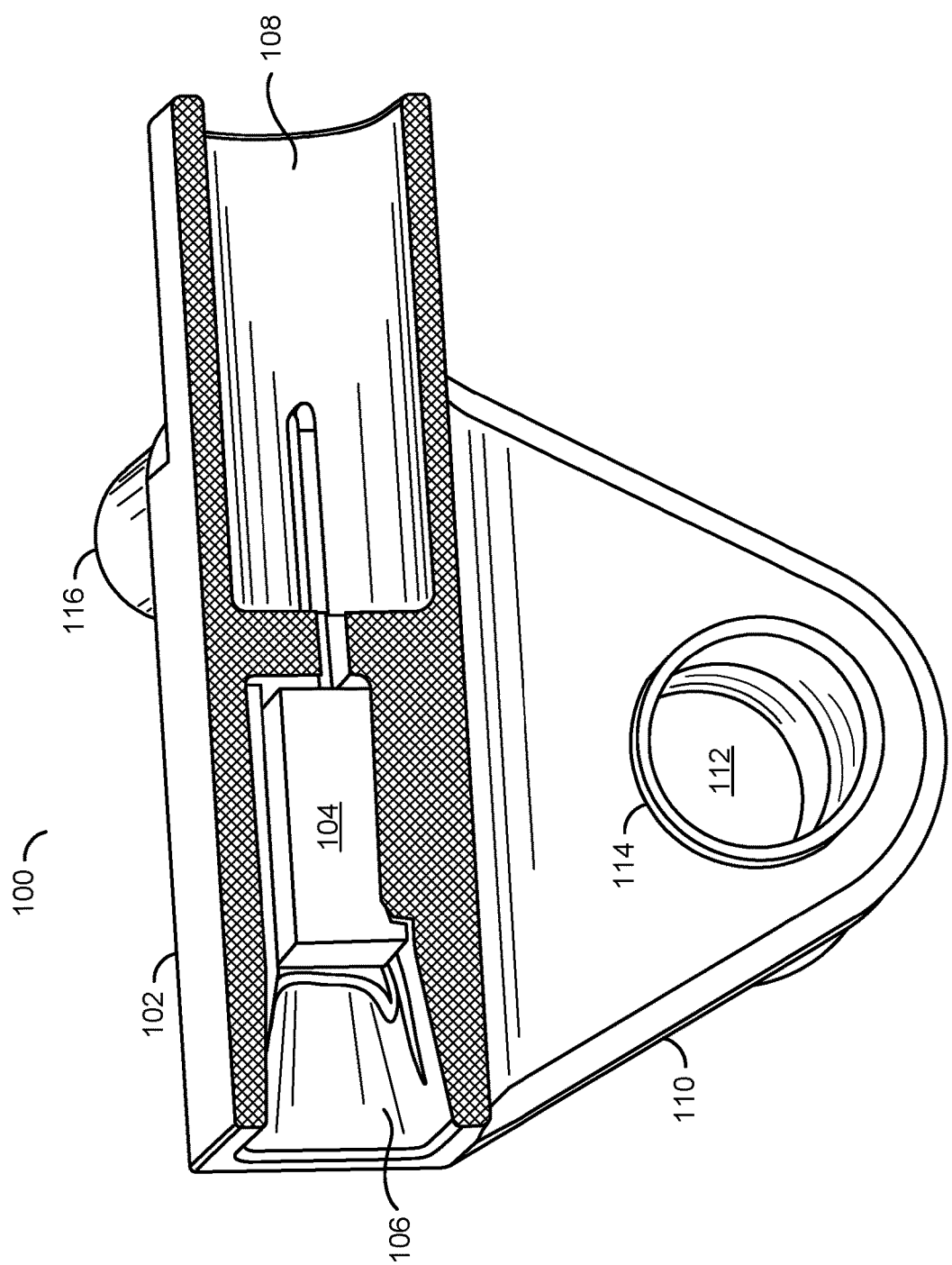
FIG. 1 is a diagram illustrating a sensor device in accordance with an embodiment of the invention.

Referring to FIG. 1, a diagram illustrating an example implementation of a sensor device 100 is shown in accordance with an embodiment of the invention. The sensor device (or apparatus or system) 100 generally implements a kinematic sensor suitable for use in automotive applications. The sensor device 100 generally comprises a housing assembly 102 and a sensor assembly 104.

The housing assembly 102 may be formed of a hard plastic material and have a generally elongated shape. The housing assembly 102 may include a sensor cavity 106, a socket cavity 108, a mounting boss 110 and a location feature 116. The mounting boss 110 may include a mounting bore 112. A limiting bushing 114 may be disposed inside the mounting bore 112. The materials used to fabricate the housing assembly 102 may include, but are not limited to, polybutylene terephthalate (PBT) and nylon, and are usually glass filled. The housing assembly 102 may be fabricated by injection molding. The limiting bushing 114 may be overmolded or inserted after the plastic injection molding process.

The sensor cavity 106 may be disposed at an end of the housing assembly 102. The sensor cavity 106 may be shaped to receive the sensor assembly 104 through an open end.

The socket cavity 108 may be formed at an opposite side of the housing assembly 102. The socket cavity 108 may be aligned with the sensor cavity 106. The socket cavity 108 is generally shaped to receive an electrical plug (or connector) to make electrical connection with the sensor assembly 104.

The mounting boss 110 is generally disposed to a side of the sensor cavity 106 and the socket cavity 108. The location and/or anti-rotation feature 116 may be disposed along another side of the sensor cavity 106 and the socket cavity 108. In various embodiments, the mounting bore 112 may be aligned parallel to the location feature 116. Other arrangements of the mounting boss 110 and the location feature 116 may be implemented to meet the design criteria of a particular application.

Figure 2:
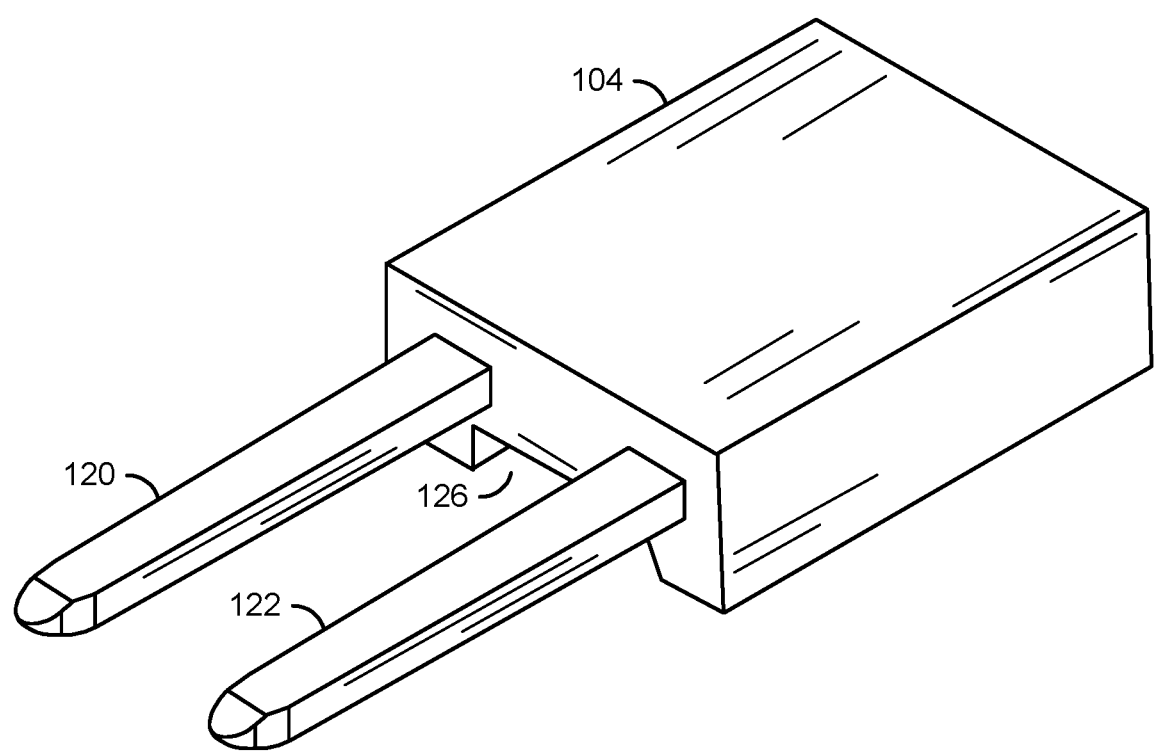
FIG. 2 is a diagram illustrating a sensor assembly within the sensor device in accordance with an embodiment of the invention.
Figure 3:
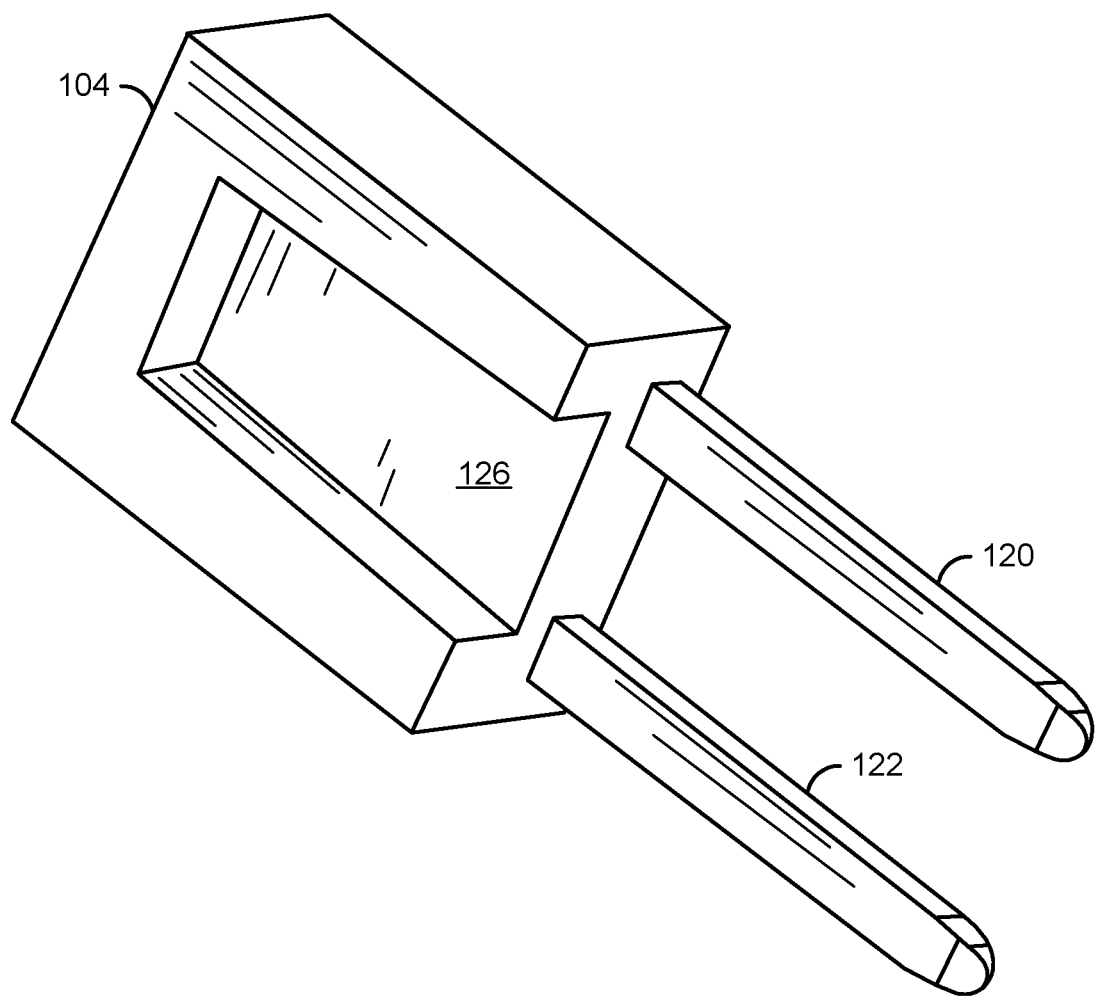
FIG. 3 is a diagram illustrating another side of the sensor assembly.

Referring to FIG. 2, a diagram illustrating an example implementation of the sensor assembly 104 is shown in accordance with an embodiment of the invention. Referring to FIG. 3, a diagram illustrating the sensor assembly 104 rotated 180 degrees is shown. The sensor assembly 104 generally comprises multiple (e.g., two) terminals 120-122 and a slot 126.

The terminals 120-122 may provide electrical communication with a sensor disposed within the sensor assembly 104. The terminals 120-122 may also provide electrical power to the sensor. Other numbers of terminals 120-122 may be implemented to meet the design criteria of a particular application. The sensor may be implemented with one or more integrated circuits.

The slot 126 may be formed in a side of the sensor assembly 104. The slot 126 generally provides for mechanical alignment of the sensor assembly 104 to a rib within the housing assembly 102. The slot 126 may also provide a mechanism to lock the sensor assembly 104 in place on the rib once fully inserted into the sensor cavity 106. The slot 126 and rib, and a generally rectangular cross-section of the sensor assembly 104 generally ensures that the sensor assembly 104 cannot be fully inserted into the sensor cavity 106 in an incorrect orientation.

Figure 4:
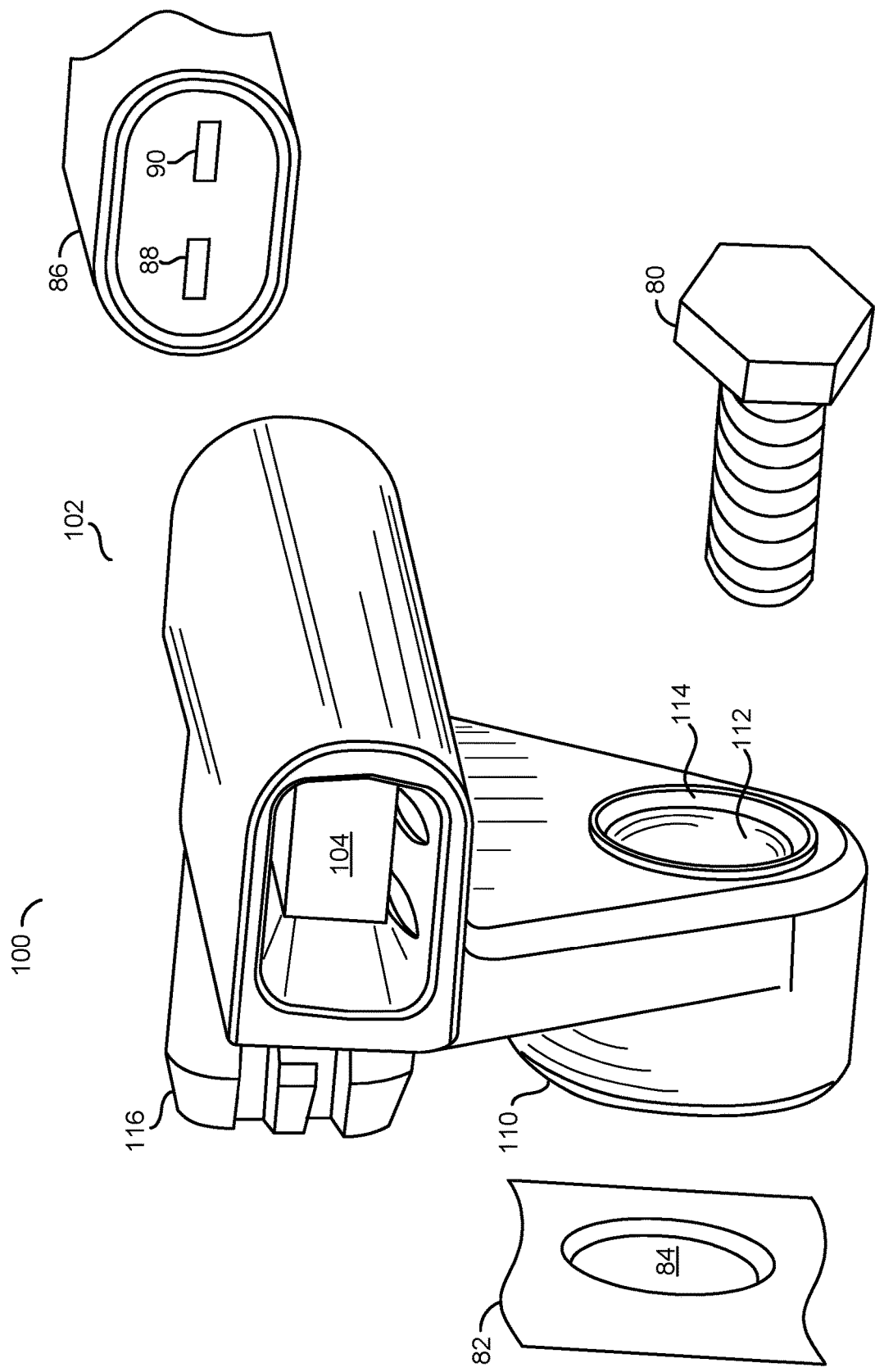
FIG. 4 is a diagram illustrating the sensor device from a sensor cavity side in accordance with an embodiment of the invention.

Referring to FIG. 4, a diagram illustrating the sensor device 100 from the sensor cavity 106 side is shown in accordance with an embodiment of the invention. The sensor device 100 may be mounted to a vehicle using a fastener (e.g., a bolt) 80 to a structure 82 of the vehicle. The fastener 80 may be passed through the mounting bore 112 into a threaded hole 84 formed in the structure 82. The limiting bushing 114 generally prevents the bolt 80 from distorting the mounting boss 110 when tightened to the structure 82.

The socket cavity 108 of the sensor device 108 may be configured to receive an electrical connector (or jack) 86. The electrical connector 86 may include multiple female sockets 88-90 aligned with the terminals 120-122 of the installed sensor assembly 104. The electrical connector 86 and the housing assembly 102 may include a locking mechanism (not shown) to prevent the electrical connector 86 from becoming loose during normal operations in the vehicle.

Figure 5:
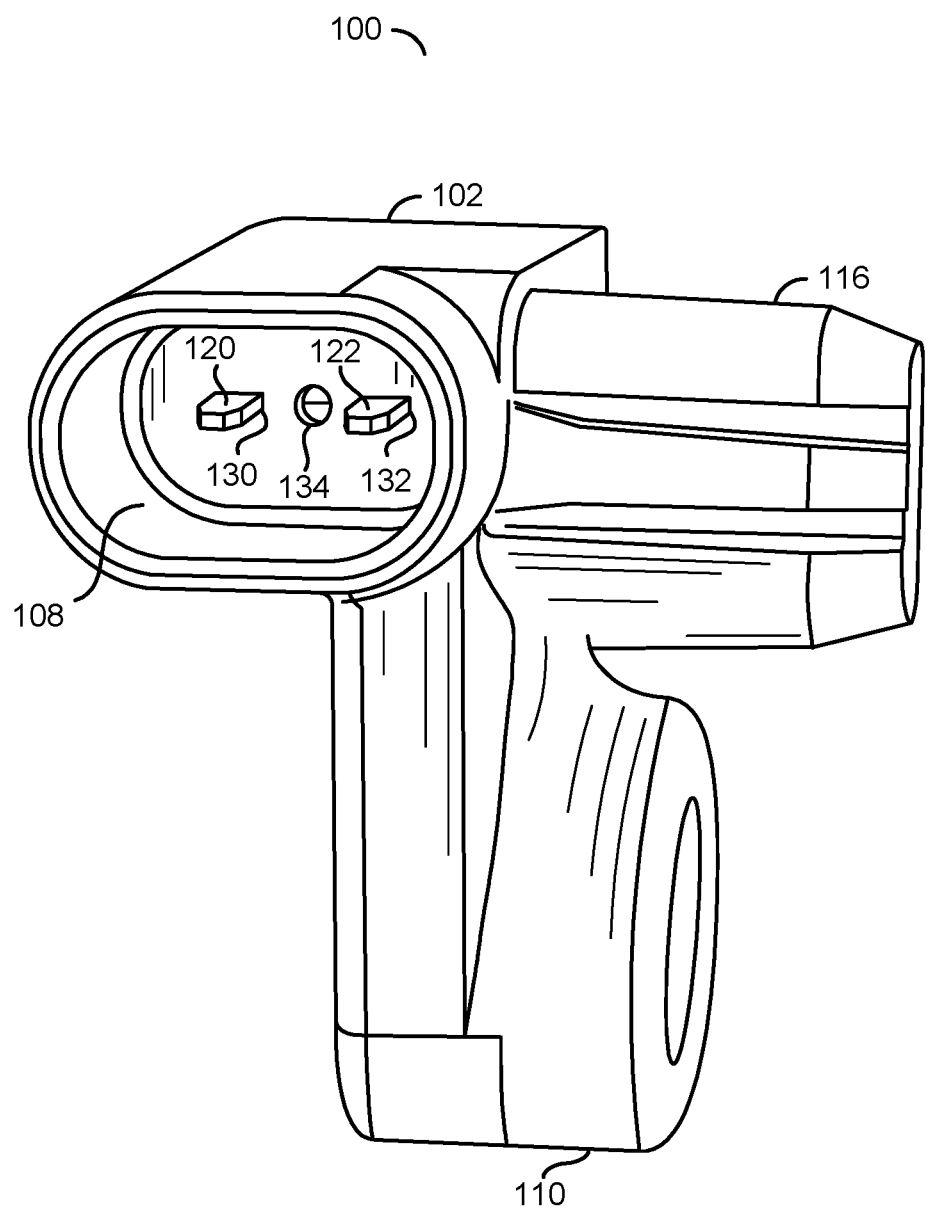
FIG. 5 is a diagram illustrating the sensor device from a socket cavity side in accordance with an embodiment of the invention.

Referring to FIG. 5, a diagram illustrating the sensor device 100 from the socket cavity 108 side is shown in accordance with an embodiment of the invention. Multiple ports 130-132 may be formed in a back wall of the socket cavity 108. The ports 130-132 may extend through the back wall and into the sensor cavity 106. The ports 130-132 may be aligned with the terminals 120-122 of the sensor assembly 104 while the sensor assembly 104 is installed in the sensor cavity 106. In various embodiments, the ports 130-132 may be formed slightly smaller than the terminals 120-122 such that an airtight seam is formed between the terminals 120-122 and the housing assembly 102. In some embodiments, the terminals 120-122 may include barbs that lock the terminals into the ports 130-132.

A vent hole 134 may be included in the back wall of the socket cavity 108. The vent hole 134 may extend through to the sensor cavity 106. During manufacture, as the sensor assembly 104 is moved into the sensor cavity 106, air trapped between the sensor assembly 104 and a back wall of the sensor cavity 106 may escape through the vent hole 134. In embodiments where a potting material is used to seal the sensor assembly 104 into the sensor cavity 106, the vent hole 134 may also allow gases formed during the curing of the potting material to escape the sensor cavity 106. A shape and/or texture of the sensor assembly 104 and/or the back wall of the sensor cavity 106 may be designed such that gases may pass between and out the vent hole 134 while the potting material is prevented from clogging the vent hole 134.

Figure 6:
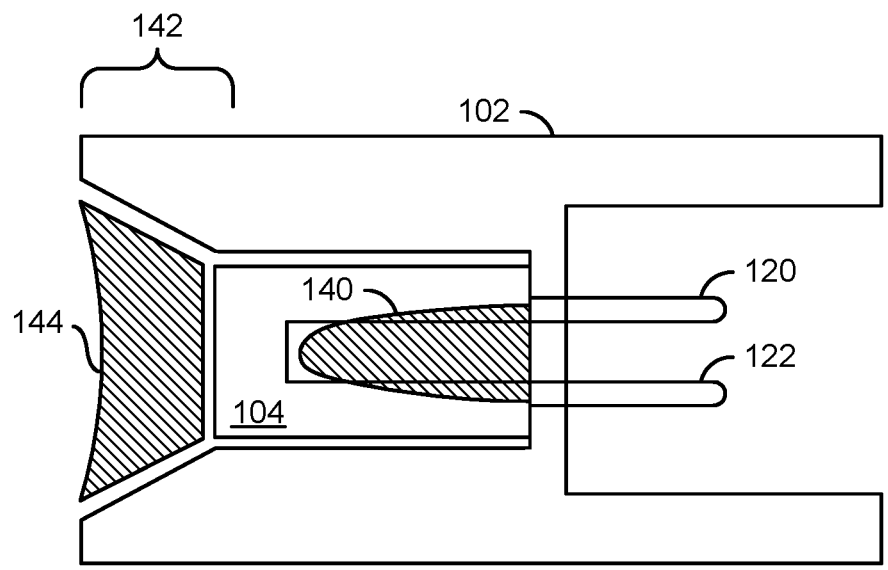
FIG. 6 is a diagram illustrating the sensor assembly installed in a housing assembly in accordance with an embodiment of the invention.

Referring to FIG. 6, a diagram illustrating the sensor assembly 104 installed in the housing assembly 102 is shown in accordance with an embodiment of the invention. A rib 140 may be formed on a surface of the sensor cavity 106 and aligned with the slot 126 of the sensor assembly 104. A tapered zone 142 may be created at the open end of the sensor cavity 106. Potting material 144 may be used to fill the open end of the sensor cavity 106 once the sensor assembly 104 has been positioned.

The tapered zone 142 generally aids in aligning the sensor assembly 104 to a final resting position while the sensor assembly 104 is being inserted into the sensor cavity 106. The tapering is generally larger than a cross-section of the sensor assembly 104 at the open end of the sensor cavity 106. A cross-section of the tapered zone 142 may approximately match the cross-section of the sensor assembly 104 away from the open end.

A lateral dimension of the rib 140 may be wider than a corresponding dimension of the slot 126. As the sensor assembly 104 moves into the sensor cavity 106, the rib 140 may engage the slot 126 to mechanically align the sensor assembly 104. The slot 126 may deform the rib 140. Forces generated between the rib 140 and walls of the slot 126 may aid in holding the sensor assembly 104 in a proper position within the sensor cavity 106.

The rib 140 may be designed to maintain the sensor assembly 104 in place during impulses experienced by the sensor device 100. Consider an example case where a maximum impulse acceleration is 12,000 meters/second$^2$ and a mass of the sensor assembly 104 is 0.7 grams. A total force (e.g., F=ma) imparted by each maximum impulse may be 8.5 Newton (N). Based on existing parts, a 0.2 millimeter (mm) overlap with a common sensor device and 15 mm of interference (height/thickness) for a common crush rib, a retainment force per 1 mm$^3$ of the common crush rib is typically 72.3 N. Therefore, keeping the sensor assembly 104 retained through the 8.5 N impulse may be achieved with (8.5 N/72.3 N/mm$^3$) 0.118 mm$^3$ of material of the rib 140.

After the sensor assembly 104 has been firmly seated, the potting material may be injected (or poured) into the open end of the sensor cavity 106 and cured. The potting material 144 may seal the sensor assembly 104 from the environment surrounding the sensor device 100. The potting material 144 may also fill small gaps between the sensor assembly 104 and the housing assembly 102 thereby provided a fixed mechanical relationship between the sensor assembly 104 and the housing assembly 102.

Figure 7:
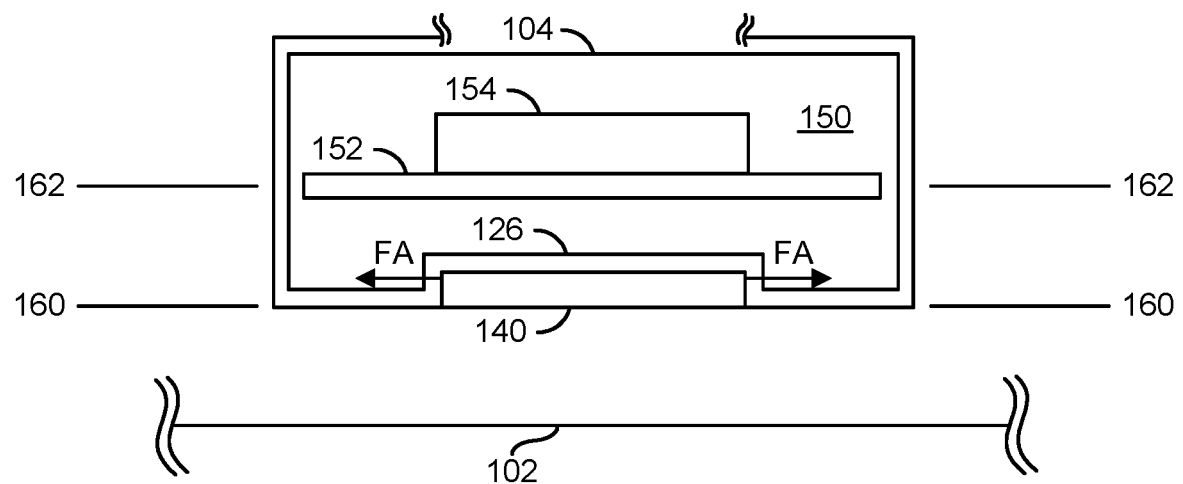
FIG. 7 is a diagram illustrating a design of the sensor assembly and the housing assembly in accordance with an embodiment of the invention.

Referring to FIG. 7, a diagram illustrating an example design of the sensor assembly 104 and the housing assembly 102 is shown in accordance with an embodiment of the invention. The sensor assembly 104 generally includes a package 150, a lead frame (or substrate or microelectromechanical systems (MEMS) carrier) 152 and a sensor 154.

The package 150 may encapsulate the lead frame 152 and the sensor 154. In various embodiments, the package 150 may be formed of a plastic material. The plastic material of the package 150 may be similar to the plastic material used to fabricate the housing assembly 102.

The slot 126 may be formed in the package 150. The lead frame 152 and the sensor 154 may be located in the package 150 away from the slot 126. In general, the slot 126 may be aligned in a plane 160. The lead frame 152 and the sensor 154 may be aligned in another plane 162. The plane 160 may be spatially separate from and parallel to the plane 162. The sensor 154 may be outside the plane 160. Therefore, forces (e.g., FA) exerted on the package 150 by the rib 140 entering the slot 126 may be directed away from the sensor 154. If the sensor 154 is sensitive to stress or strain, the forces FA between the rib 140 and the slot 126 may not be detected.

Figure 8:
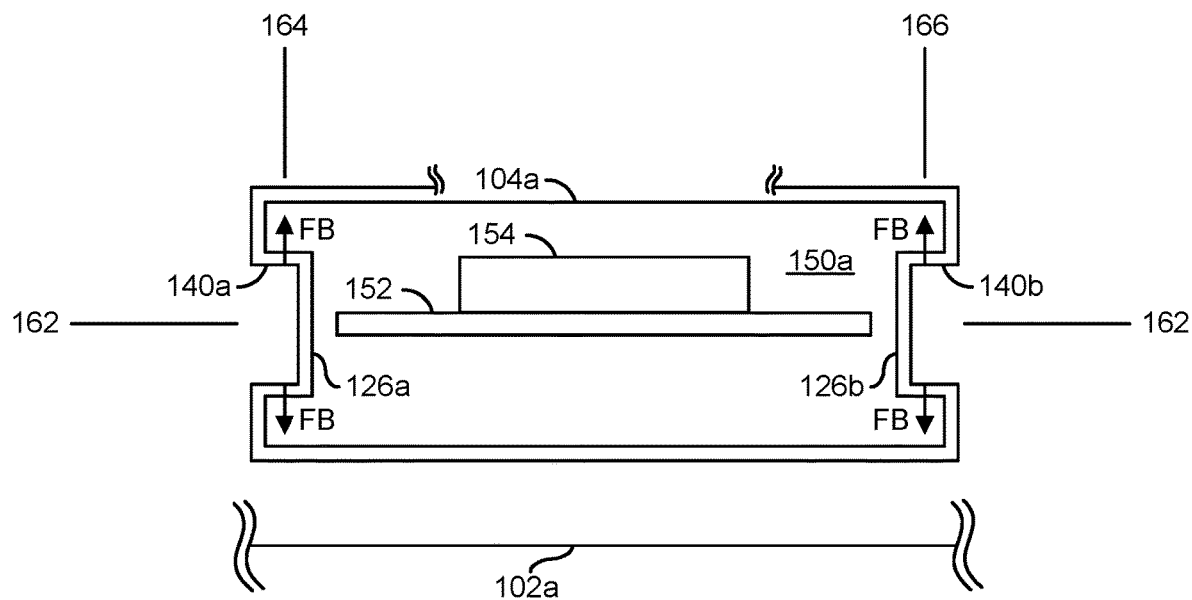
FIG. 8 is a diagram illustrating another design of a sensor assembly and a housing assembly in accordance with an embodiment of the invention.

Referring to FIG. 8, a diagram illustrating an example design of another sensor assembly 104a and a housing assembly 102a is shown in accordance with an embodiment of the invention. The sensor assembly 104a may be a variation of the sensor assembly 104. The housing assembly 102a may be a variation of the housing assembly 102. The sensor assembly 104a generally includes a package 150a, the lead frame 152 and the sensor 154.

The package 150a may encapsulate the lead frame 152 and the sensor 154. The package 150a may be a variation of the package 150. In various embodiments, the package 150a may be formed of a plastic material. The plastic material of the package 150a may be similar to the plastic material used to fabricate the housing assembly 102a.

Two slots 126a and 126b may be formed in the package 150a. The slot 126a may be aligned in a plane 164. The slot 126b may be aligned in a plane 166. The lead frame 152 and the sensor 154 may be aligned in the plane 162 and located in the package 150a away from the slots 126a and 126b. The plane 162 may be spatially separate from and perpendicular to the planes 164 and 166. The sensor 154 may be outside the planes 164 and 166. Therefore, forces (e.g., FB) exerted on the package 150a by the ribs 140d and 140e of the housing assembly 102a entering the slots 126a and 126b may be directed away from the sensor 154.

Figure 9:
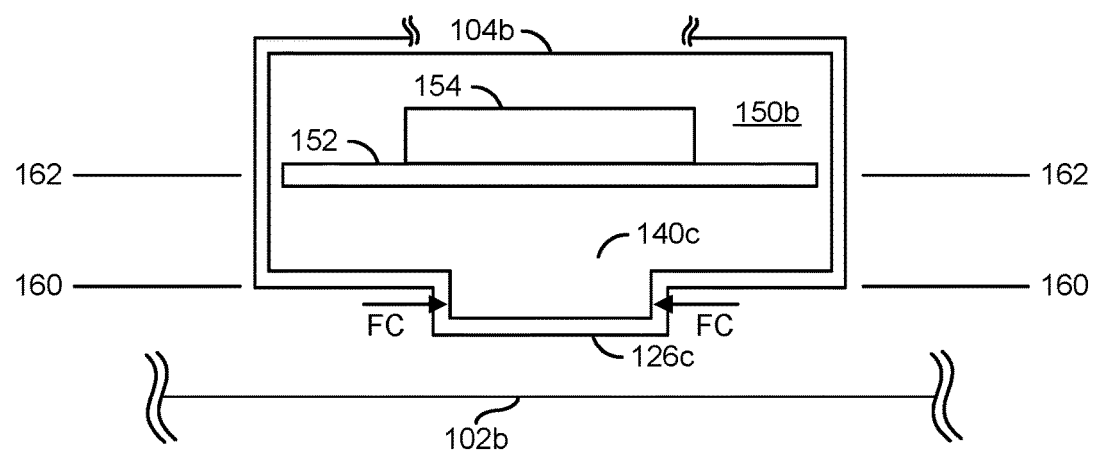
FIG. 9 is a diagram illustrating yet another design of a sensor assembly and a housing assembly in accordance with an embodiment of the invention.

Referring to FIG. 9, a diagram illustrating an example design of another sensor assembly 104b and a housing assembly 102b is shown in accordance with an embodiment of the invention. The sensor assembly 104b may be a variation of the sensor assemblies 104 and/or 104a. The housing assembly 102b may be a variation of the housing assemblies 102 and/or 102a. The sensor assembly 104b generally includes a package 150b, the lead frame 152 and the sensor 154.

The package 150b may encapsulate the lead frame 152 and the sensor 154. The package 150b may be a variation of the packages 150 and/or 150a. In various embodiments, the package 150b may be formed of a plastic material. The plastic material of the package 150b may be similar to the plastic material used to fabricate the housing assembly 102b.

A slot 126c may be formed in the housing assembly 102b. A rib 140c may be formed in the package 150b. The slot 126c may be aligned in the plane 160. The lead frame 152 and the sensor 154 may be aligned in the plane 162 and located in the package 150b away from the slot 126c. The plane 160 may be spatially separate from and parallel to the plane 162. The sensor 154 may be outside the plane 160. Therefore, forces (e.g., FC) exerted on the package 150b by the rib 140c of the package 150b entering the slot 126c may be directed away from the sensor 154.

Figure 10:
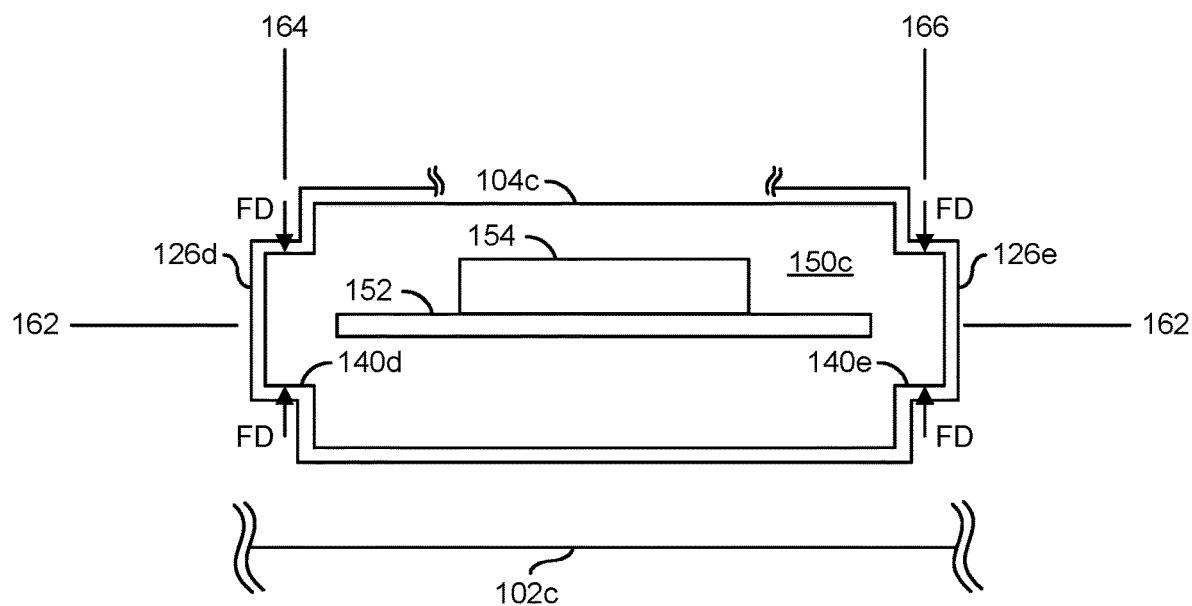
FIG. 10 is a diagram illustrating still another design of a sensor assembly and a housing assembly in accordance with an embodiment of the invention.

Referring to FIG. 10, a diagram illustrating an example design of another sensor assembly 104c and a housing assembly 102c is shown in accordance with an embodiment of the invention. The sensor assembly 104c may be a variation of the sensor assemblies 104, 104a and/or 104b. The housing assembly 102c may be a variation of the housing assemblies 102, 102a and/or 102b. The sensor assembly 104c generally includes a package 150c, the lead frame 152 and the sensor 154.

The package 150c may encapsulate the lead frame 152 and the sensor 154. The package 150c may be a variation of the packages 150, 105a and/or 150b. In various embodiments, the package 150c may be formed of a plastic material. The plastic material of the package 150c may be similar to the plastic material used to fabricate the housing assembly 102c.

Two slots 126d and 126e may be formed in the housing assembly 102c. The slot 126d may be aligned in the plane 164. The slot 126e may be aligned in the plane 166. The lead frame 152 and the sensor 154 may be aligned in the plane 162 and located in the package 150c away from the slots 126d and 126e. The plane 162 may be spatially separate from and perpendicular to the planes 164 and 166. The sensor 154 may be outside the planes 164 and 166. Therefore, forces (e.g., FD) exerted on the package 150c by the ribs 140d and 140e of the package 150c entering the slots 126d and 126e may be directed away from the sensor 154.

Figure 11:
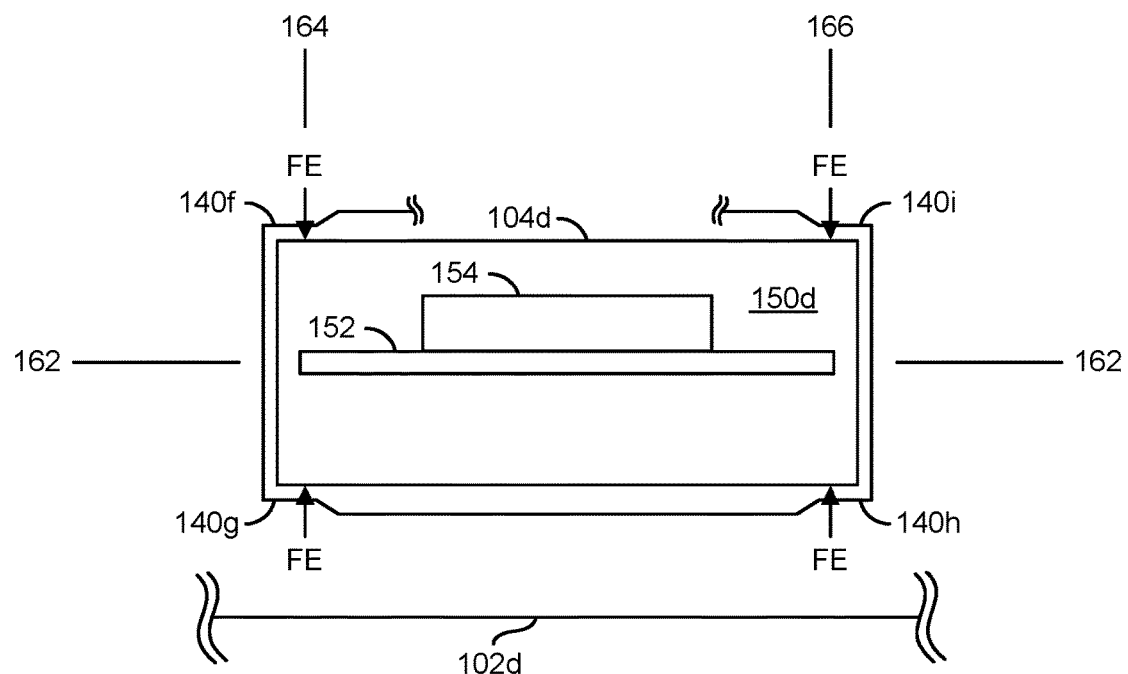
FIG. 11 is a diagram illustrating another design of a sensor assembly and a housing assembly in accordance with an embodiment of the invention.

Referring to FIG. 11, a diagram illustrating an example design of another sensor assembly 104d and a housing assembly 102d is shown in accordance with an embodiment of the invention. The sensor assembly 104d may be a variation of the sensor assemblies 104, 104a, 104b and/or 104c. The housing assembly 102d may be a variation of the housing assemblies 102, 102a, 102b and/or 102c. The sensor assembly 104d generally includes a package 150d, the lead frame 152 and the sensor 154.

The package 150d may encapsulate the lead frame 152 and the sensor 154. The package 150d may be a variation of the packages 150, 105a, 150b and/or 150c. In various embodiments, the package 150d may be formed of a plastic material. The plastic material of the package 150d may be similar to the plastic material used to fabricate the housing assembly 102d.

Multiple (e.g., four) ribs 140ƒ-140i may be formed in the housing assembly 102d. The ribs 140ƒ and 140g may be aligned in the plane 164. The ribs 140h and 140i may be aligned in the plane 166. The lead frame 152 and the sensor 154 may be aligned in the plane 162 and located in the package 150d away from the ribs 140ƒ-140i. The plane 162 may be spatially separate from and perpendicular to the planes 164 and 166. Therefore, forces (e.g., FE) exerted on the package 150d by the ribs 140ƒ-140i of the housing assembly 102d may be directed away from the sensor 154.

Figure 12:
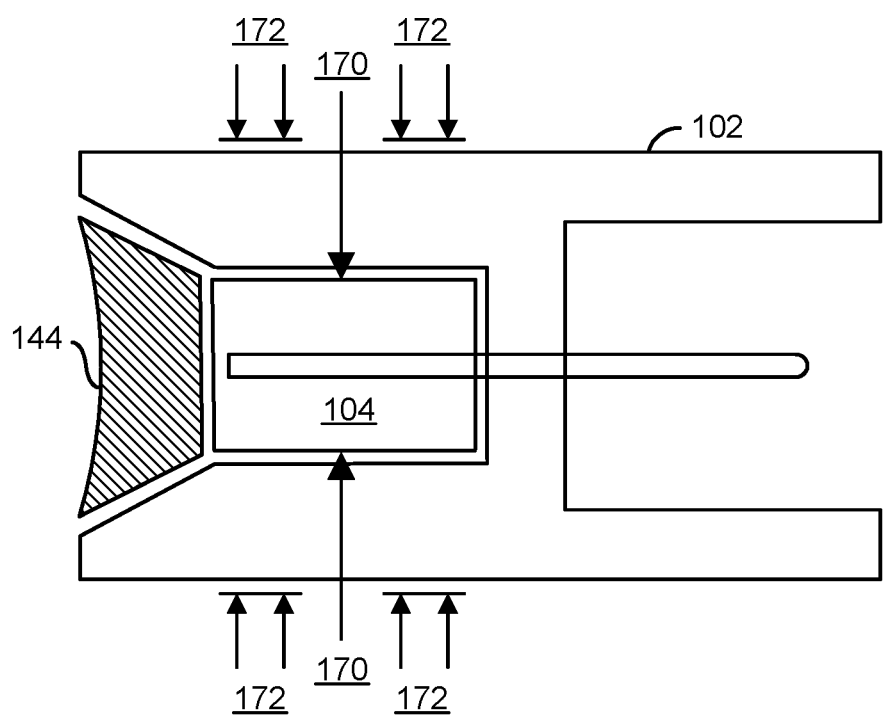
FIG. 12 is a diagram illustrating a laser welding technique in accordance with an embodiment of the invention.

Referring to FIG. 12, a diagram illustrating an example implementation of a laser welding technique is shown in accordance with an embodiment of the invention. The plastic material used to fabricate the housing assembly 102, or at least a portion of the housing assembly 102 adjoining the installed sensor assembly 104 may be selected to be transparent or semi-transparent to a welding laser beam (or light) 170. The material used to create the package 150 of the sensor assembly 104 may be selected to readily absorb the laser beam 170.

During laser welding, one or more laser beams 170 may be directed through one or more walls of sensor cavity 106 of the housing assembly 102 onto the package 150 of the sensor assembly 104. The laser beams 170 may locally heat the package 150 of the sensor assembly 104 and/or the walls of the sensor cavity 106. The heat may partially melt a surface layer of the sensor assembly 104 and/or the wall of the sensor cavity 106. The melted plastic may fuse (or weld) the sensor assembly 104 to the inside of the housing assembly 102. Pressure 172 may be optionally applied to the housing assembly 102 to improve the contact and fusing of the zones of melted plastic.

Figure 13:
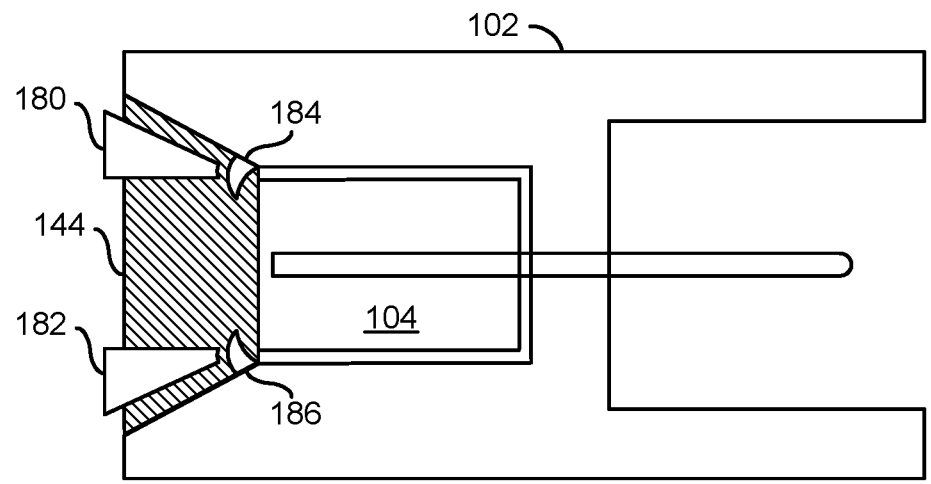
FIG. 13 is a diagram illustrating a swaging technique in accordance with an embodiment of the invention.

Referring to FIG. 13, a diagram illustrating an example implementation of a swagging technique is shown in accordance with an embodiment of the invention. After the potting material 144 has been cured, the inner walls of the sensor cavity 106 may be swagged to help lock the sensor assembly 104 in place. The swagging is generally achieved by inserting a sharp and/or hot blade into the housing material at one or more locations 180-182. The blade (or blades) may be heated to allow for better flow of the material and retention of mechanical properties. The blades may be angled to cut into the inner wall of the sensor cavity 106. Each cut may bend a portion 184-186 of the inner wall toward a central axis of the sensor cavity 106. The portions 184-186 generally lock the sensor assembly 104 into the housing apparatus 102. In various embodiments, the swagging may be performed before the potting material is introduced and cured.

Figure 14:
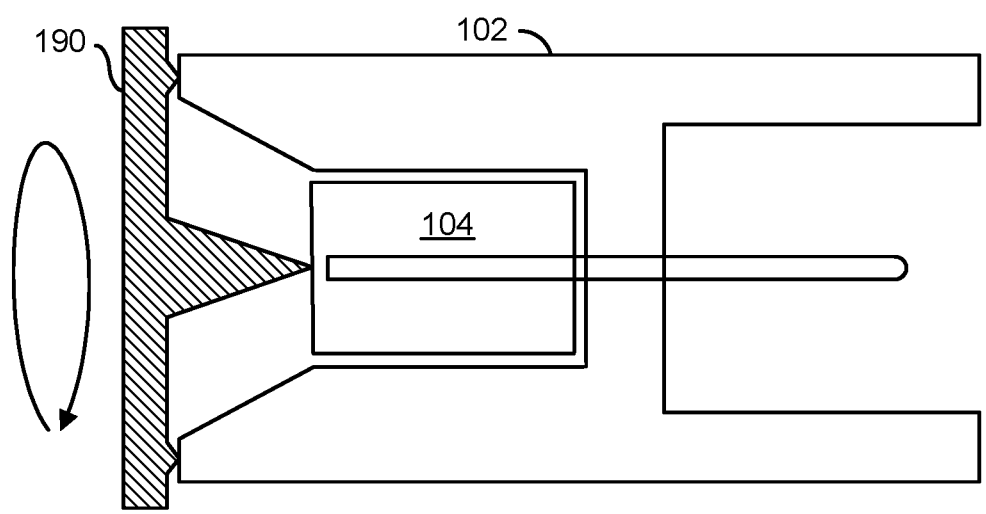
FIG. 14 is a diagram of a diagram illustrating a spin welding technique in accordance with an embodiment of the invention.

Referring to FIG. 14, a diagram illustrating an example implementation of a spin welding technique is shown in accordance with an embodiment of the invention. A cover 190 may be used to seal the open end of the sensor cavity 106 after the sensor assembly 104 has been installed. The cover 190 may be rotated at a high speed and brought into contact with the housing assembly 102 over the open end. Friction between the cover 190 and the housing assembly 102 may locally melt a layer of the housing assembly 102 and/or the cover 190. The melted material may weld (or fuse) the cover 190 to the housing assembly 102. The cover material may be chosen from a group of materials that are compatible for plastic welding with the housing material. In various embodiments, the cover material may be the same as the housing material. Standard rotation speeds and pressures may be used to achieve the welding. Other types of welding techniques may include, but are not limited to, ultrasonic welding and industry standard plastic welding techniques.

Figure 15:
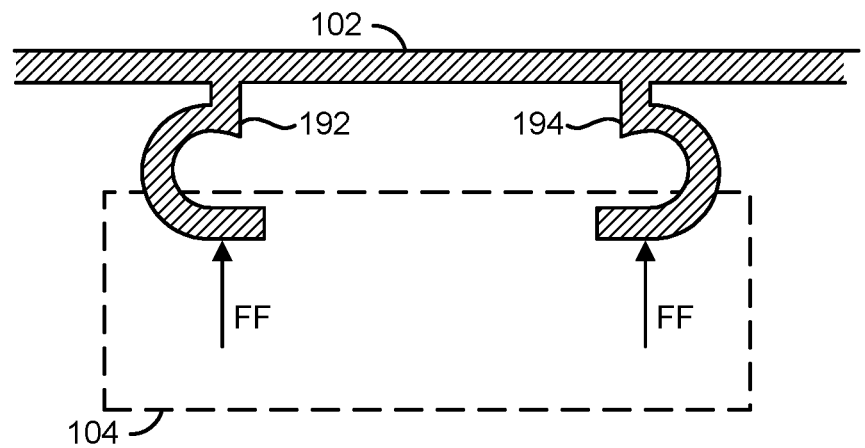
FIG. 15 is a diagram illustrating deformable features in accordance with an embodiment with the invention.

Referring to FIG. 15, a diagram illustrating an example implementation of deformable features is shown in accordance with an embodiment with the invention. The inside wall of the sensor cavity 106 may include one or more deformable features 192-194. The deformable features 192-194 may have a "C" shape and extend a sufficient distance to interact with the sensor assembly 104 during installation. The deformable features 192-194 generally bias the sensor assembly 104 against an opposing surface of the sensor cavity 106 with a force (e.g., FF).

Figure 16:
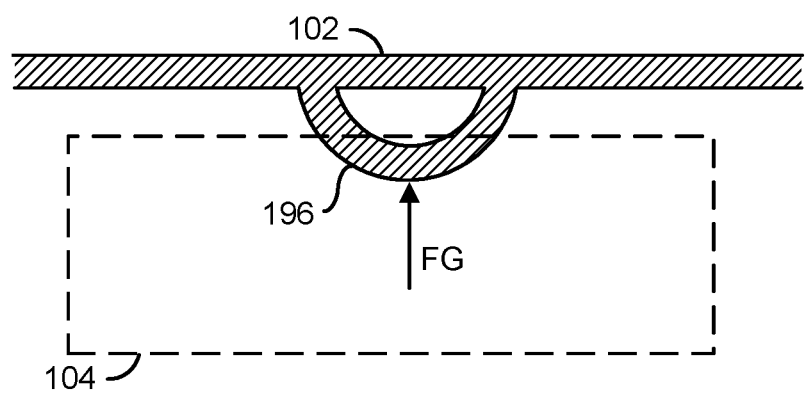
FIG. 16 is a diagram illustrating another deformable feature in accordance with an embodiment with the invention.

Referring to FIG. 16, a diagram illustrating an example implementation of another deformable feature is shown in accordance with an embodiment with the invention. The inside wall of the sensor cavity 106 may include one or more deformable features 196 (one shown). The deformable features 196 may have a bubble shape and extend a sufficient distance to contact with the sensor assembly 104 during installation. The deformable features 196 may be resilient and generally bias the sensor assembly 104 against an opposing surface of the sensor cavity 106 with a force (e.g., FG).

The structures illustrated in the diagrams of FIGS. 1 to 16 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Data signals generated by the sensor units (or devices) may be transferred to one or more electronic control units. The electronic control units may utilize the sensor data in one or more transport vehicle functions including, but not limited to, engine control, transmission control, braking control, battery management, steering control, door control, human machine interface, seat control, speed control, restraint systems control, vehicle-to-vehicle communications and diagnostics. The electronic control units may include capabilities to adjust the sensor data to account for calibration issues, environmental factors and aging components.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a sensor assembly having (i) a package surrounding a sensor and (ii) a plurality of terminals integrated with said package, wherein said sensor comprises a kinematic sensor; and
a housing assembly having (i) a first cavity configured to receive said sensor assembly, (ii) a second cavity configured to receive an electrical connector, (iii) a plurality of ports in communication between said first cavity and said second cavity and (iv) a location feature configured to orient said housing assembly while said housing assembly is mounted to a structure, wherein (a) at least one rib applies at least one force on said package of said sensor assembly to hold said sensor assembly in said first cavity, (b) said sensor is outside a plane of said force and (c) said terminals extend through said ports from said first cavity to said second cavity.

2. The apparatus according to claim 1, wherein said structure is part of a motor vehicle.

3. The apparatus according to claim 1, wherein said at least one rib is (i) disposed inside said first cavity and (ii) deformed by at least one slot of said sensor assembly while said sensor assembly is installed in said first cavity.

4. The apparatus according to claim 3, wherein said at least one rib prevents improper orientation of said sensor assembly in said housing assembly.

5. The apparatus according to claim 3, wherein said at least one rib is (i) formed on an inner surface in said first cavity and (ii) deformed by walls of said at least one slot formed in an outer surface of said package.

6. The apparatus according to claim 1, wherein said at least one rib is (i) disposed on an outer surface of said package of said sensor assembly and (ii) deformed by at least one slot in an inner surface of said first cavity while said sensor assembly is installed in said first cavity.

7. The apparatus according to claim 1, wherein said housing assembly further provides a vent hole (i) in communication between said first cavity and said second cavity and (ii) configured to pass air from said first cavity while said first cavity is being filled with a potting material.

8. The apparatus according to claim 7, wherein said sensor assembly blocks said potting material from clogging said vent hole.

9. The apparatus according to claim 1, wherein said housing assembly further comprises a tapered zone in said first cavity that is (i) larger than a cross-section of said sensor assembly at an open end of said first cavity and (ii) approximately matches said cross-section of said sensor assembly distant from said open end.

10. The apparatus according to claim 1, wherein said housing assembly further comprises a mounting boss configured to receive a fastener that secures said housing assembly to said structure.

11. The apparatus according to claim 1, further comprising a potting material disposed in said first cavity to seal in said sensor assembly inside said housing assembly.

12. The apparatus according to claim 11, wherein said housing assembly is swagged to hold said sensor assembly in place.

13. The apparatus according to claim 1, wherein said sensor assembly is laser welded to said housing assembly.

14. The apparatus according to claim 1, further comprising a cover (i) welded to said housing assembly and (ii) configured to seal in said sensor assembly inside said housing assembly.

15. The apparatus according to claim 1, wherein said housing assembly further comprises one or more deformable features (i) disposed in said first cavity and (ii) configured to bias said sensor assembly against a side of said first cavity.

16. A housing assembly comprising:
a first cavity configured to receive a sensor assembly comprising a package encapsulating a kinematic sensor and having a plurality of integrated terminals;
a second cavity configured to receive an electrical connector;
a plurality of ports in communication between said first cavity and said second cavity; and
a location feature configured to orient said housing assembly while said housing assembly is mounted to a structure, wherein (a) at least one rib applies at least one force on said package of said sensor assembly to hold said sensor assembly in said first cavity, (b) said kinematic sensor is outside a plane of said force, and (c) said terminals extend through said ports from said first cavity to said second cavity.

17. The housing assembly according to claim 16, wherein said structure is part of a motor vehicle.

18. An apparatus comprising:
a sensor assembly having (i) a package surrounding a sensor and (ii) a plurality of terminals integrated with said package; and
a housing assembly having (i) a first cavity configured to receive said sensor assembly, (ii) a second cavity configured to receive an electrical connector, (iii) a plurality of ports in communication between said first cavity and said second cavity, (iv) a location feature configured to orient said housing assembly while said housing assembly is mounted to a structure, and (v) a vent hole in communication between said first cavity and said second cavity, wherein (a) at least one rib applies at least one force on said package of said sensor assembly to hold said sensor assembly in said first cavity, (b) said sensor is outside a plane of said force, (c) said terminals extend through said ports from said first cavity to said second cavity, and (d) said vent hole is configured to pass air from said first cavity while said first cavity is being filled with a potting material.

19. The apparatus according to claim 18, wherein said sensor assembly blocks said potting material from clogging said vent hole.

* * * * *